United States Patent
Sample et al.

[19]

[11] Patent Number: 6,058,492
[45] Date of Patent: *May 2, 2000

[54] METHOD AND APPARATUS FOR DESIGN VERIFICATION USING EMULATION AND SIMULATION

[75] Inventors: Stephen P. Sample, Saratoga; Mikhail Bershteyn, Campbell, both of Calif.

[73] Assignee: Quickturn Design Systems, Inc., Mountain View, Calif.

[*] Notice: This patent is subject to a terminal disclaimer.

[21] Appl. No.: 09/191,228

[22] Filed: Nov. 12, 1998

Related U.S. Application Data

[63] Continuation of application No. 08/733,352, Oct. 17, 1996, Pat. No. 5,841,967.

[51] Int. Cl.[7] .................................................. G06F 11/263
[52] U.S. Cl. .......................... 714/33; 364/578; 364/232.3
[58] Field of Search ................................. 714/33, 28, 29, 714/37, 741; 364/232.3, 933.8, 488, 489, 578

[56] References Cited

U.S. PATENT DOCUMENTS

| | | | |
|---|---|---|---|
| 3,106,698 | 10/1963 | Unger | 340/172.5 |
| 3,287,702 | 11/1966 | Borck, Jr. et al. | 340/172.5 |
| 3,287,703 | 11/1966 | Slotnick | 340/172.5 |
| 3,473,160 | 10/1969 | Wahlstrom | 340/172.5 |
| 3,928,730 | 12/1975 | Aagaard et al. | 179/18 |
| 4,020,469 | 4/1977 | Manning | 340/172.5 |
| 4,032,899 | 6/1977 | Jenny et al. | 364/200 |
| 4,306,286 | 12/1981 | Cocke et al. | 364/200 |
| 4,315,315 | 2/1982 | Kossiakoff | 364/300 |
| 4,357,678 | 11/1982 | Davis | 364/900 |
| 4,386,403 | 5/1983 | Hsieh et al. | 364/300 |
| 4,404,635 | 9/1983 | Flaker | 364/481 |
| 4,459,694 | 7/1984 | Ueno et al. | 371/21 |
| 4,488,354 | 12/1984 | Chan et al. | 29/830 |
| 4,503,386 | 3/1985 | DasGupta et al. | 324/73 |

(List continued on next page.)

FOREIGN PATENT DOCUMENTS

| | | |
|---|---|---|
| 0 372 833 A2 | 6/1990 | European Pat. Off. . |
| 0453171A2 | 10/1991 | European Pat. Off. .......... G06F 1/04 |
| 0 777 180 A2 | 6/1997 | European Pat. Off. ........ G06F 15/60 |
| 58-147236 | 9/1983 | Japan ........................... H03K 19/177 |
| 58-147237 | 9/1983 | Japan ........................... H03K 19/177 |
| 58-205870 | 11/1983 | Japan ........................... G01R 31/28 |
| 59-161839 | 9/1984 | Japan ............................. H01L 21/82 |
| 01154251 | 6/1989 | Japan . |
| 1444084 | 9/1973 | United Kingdom ........... H03K 19/00 |
| 2180382 | 3/1987 | United Kingdom ........... H03K 19/00 |
| 2182220 | 5/1987 | United Kingdom ......... H03K 17/687 |
| WO96/28788 | 9/1996 | WIPO . |

OTHER PUBLICATIONS

Hennessy, "Partitioning Programmable Logic Arrays Summary," Computer Systems Laboratory, Stanford University, undated, pp. 180–181.

"Plus Logic FPGA 2020 Field Programmable Gate Array," Brochure by Plus Logic, San Jose, CA, undated, pp. 1–13.

(List continued on next page.)

*Primary Examiner*—Robert W. Beausoliel, Jr.
*Assistant Examiner*—Scott T. Baderman
*Attorney, Agent, or Firm*—Lyon & Lyon LLP

[57] ABSTRACT

A method and apparatus for combining emulation and simulation of a logic design. The method and apparatus can be used with a logic design that includes gate-level descriptions, behavioral representations, structural representations, or a combination thereof. The emulation and simulation portions are combined in a manner that minimizes the time for transferring data between the two portions. Simulation is performed by one or more microprocessors while emulation is performed in reconfigurable hardware such as field programmable gate arrays. When multiple microprocessors are employed, independent portions of the logic design are selected to be executed on the multiple synchronized microprocessors. Reconfigurable hardware also performs event detecting and scheduling operations to aid the simulation, and to reduce processing time.

7 Claims, 11 Drawing Sheets

U.S. PATENT DOCUMENTS

| | | | |
|---|---|---|---|
| 4,510,602 | 4/1985 | Engdahl et al. | 371/21 |
| 4,524,240 | 6/1985 | Stock et al. | 174/685 |
| 4,525,789 | 7/1985 | Kemper et al. | 364/481 |
| 4,527,115 | 7/1985 | Mehrotra et al. | 324/73 |
| 4,539,564 | 9/1985 | Smithson | 340/825.79 |
| 4,541,071 | 9/1985 | Ohmori | 364/900 |
| 4,577,276 | 3/1986 | Dunlop et al. | 364/491 |
| 4,578,761 | 3/1986 | Gray | 364/481 |
| 4,593,363 | 6/1986 | Burstein et al. | 364/491 |
| 4,600,846 | 7/1986 | Burrows | 307/465 |
| 4,612,618 | 9/1986 | Pryor et al. | 364/490 |
| 4,613,940 | 9/1986 | Shenton et al. | 364/490 |
| 4,621,339 | 11/1986 | Wagner et al. | 364/900 |
| 4,642,487 | 2/1987 | Carter | 307/465 |
| 4,656,580 | 4/1987 | Hitchcock, Sr. et al. | 364/200 |
| 4,656,592 | 4/1987 | Spaanenburg et al. | 364/490 |
| 4,674,089 | 6/1987 | Poret et al. | 371/25 |
| 4,675,832 | 6/1987 | Robinson et al. | 364/521 |
| 4,695,740 | 9/1987 | Carter | 307/242 |
| 4,695,950 | 9/1987 | Brandt et al. | 364/200 |
| 4,695,968 | 9/1987 | Sullivan, II et al. | 364/578 |
| 4,695,999 | 9/1987 | Lebizay | 370/58 |
| 4,697,241 | 9/1987 | Lavi | 364/488 |
| 4,700,187 | 10/1987 | Furtek | 340/825.83 |
| 4,706,216 | 11/1987 | Carter | 365/94 |
| 4,713,557 | 12/1987 | Carter | 307/242 |
| 4,722,084 | 1/1988 | Morton | 371/9 |
| 4,725,835 | 2/1988 | Schreiner et al. | 340/825.83 |
| 4,736,338 | 4/1988 | Saxe et al. | 364/900 |
| 4,740,919 | 4/1988 | Elmer | 365/104 |
| 4,744,084 | 5/1988 | Beck et al. | 371/23 |
| 4,747,102 | 5/1988 | Funatsu | 371/23 |
| 4,752,887 | 6/1988 | Kuwahara | 364/491 |
| 4,758,745 | 7/1988 | El Gamal et al. | 307/465 |
| 4,758,985 | 7/1988 | Carter | 365/94 |
| 4,761,768 | 8/1988 | Turner et al. | 365/201 |
| 4,766,569 | 8/1988 | Turner et al. | 365/185 |
| 4,768,196 | 8/1988 | Jou et al. | 371/25 |
| 4,777,606 | 10/1988 | Fournier | 364/491 |
| 4,782,440 | 11/1988 | Nomizu et al. | 364/200 |
| 4,786,904 | 11/1988 | Graham, III et al. | 340/825.83 |
| 4,787,061 | 11/1988 | Nei et al. | 364/900 |
| 4,787,062 | 11/1988 | Nei et al. | 364/900 |
| 4,791,602 | 12/1988 | Resnick | 364/900 |
| 4,803,636 | 2/1989 | Nishiyama et al. | 364/491 |
| 4,811,214 | 3/1989 | Nosenchuck et al. | 364/200 |
| 4,815,003 | 3/1989 | Putatunda et al. | 364/491 |
| 4,823,276 | 4/1989 | Hiwatashi | 364/491 |
| 4,827,427 | 5/1989 | Hyduke | 364/489 |
| 4,829,202 | 5/1989 | Austin | 307/465 |
| 4,835,705 | 5/1989 | Fujino et al. | 364/491 |
| 4,845,633 | 7/1989 | Furtek | 364/490 |
| 4,849,904 | 7/1989 | Aipperspach et al. | 364/489 |
| 4,849,928 | 7/1989 | Hauck | 364/900 |
| 4,854,039 | 8/1989 | Wendt | 29/832 |
| 4,855,669 | 8/1989 | Mahoney | 324/73 |
| 4,862,347 | 8/1989 | Rudy | 364/200 |
| 4,864,165 | 9/1989 | Hoberman et al. | 307/467 |
| 4,868,419 | 9/1989 | Austin | 307/440 |
| 4,870,302 | 9/1989 | Freeman | 307/465 |
| 4,873,459 | 10/1989 | El Gamal et al. | 307/465 |
| 4,876,466 | 10/1989 | Kondou et al. | 307/465 |
| 4,882,690 | 11/1989 | Shinsha et al. . | |
| 4,901,259 | 2/1990 | Watkins | 364/578 |
| 4,901,260 | 2/1990 | Lubachevsky | 364/578 |
| 4,908,772 | 3/1990 | Chi | 364/491 |
| 4,914,612 | 4/1990 | Beece et al. | 364/578 |
| 4,918,440 | 4/1990 | Furtek | 340/825.83 |
| 4,918,594 | 4/1990 | Onizuka | 364/208 |
| 4,922,432 | 5/1990 | Kobayashi et al. | 364/490 |
| 4,924,429 | 5/1990 | Kurashita et al. | 364/578 |
| 4,931,946 | 6/1990 | Ravindra et al. | 364/490 |
| 4,935,734 | 6/1990 | Austin | 340/825.83 |
| 4,937,827 | 6/1990 | Beck et al. | 371/23 |
| 4,942,536 | 7/1990 | Watanabe et al. | 364/490 |
| 4,942,615 | 7/1990 | Hirose | 364/578 |
| 4,945,503 | 7/1990 | Takasaki | 364/578 |
| 4,949,275 | 8/1990 | Nonaka | 364/490 |
| 4,951,220 | 8/1990 | Ramacher et al. | 364/488 |
| 4,965,739 | 10/1990 | Ng | 364/491 |
| 4,972,372 | 11/1990 | Ueno | 365/201 |
| 5,003,487 | 3/1991 | Drumm et al. | 364/489 |
| 5,023,775 | 6/1991 | Poret | 364/200 |
| 5,036,473 | 7/1991 | Butts et al. | 364/489 |
| 5,041,986 | 8/1991 | Tanishita | 364/489 |
| 5,046,017 | 9/1991 | Yuyama et al. | 364/491 |
| 5,051,938 | 9/1991 | Hyduke | 364/578 |
| 5,053,980 | 10/1991 | Kanazawa | 364/578 |
| 5,081,602 | 1/1992 | Glover | 364/578 |
| 5,083,083 | 1/1992 | El-Ayat et al. | 324/158 |
| 5,084,824 | 1/1992 | Lam et al. | 364/490 |
| 5,093,920 | 3/1992 | Agrawal et al. | 395/800 |
| 5,109,353 | 4/1992 | Sample et al. | 364/578 |
| 5,126,966 | 6/1992 | Hafeman et al. | 364/500 |
| 5,128,871 | 7/1992 | Schmitz | 364/490 |
| 5,140,526 | 8/1992 | McDermith et al. | 364/488 |
| 5,172,011 | 12/1992 | Leuthold et al. | 307/272.2 |
| 5,224,055 | 6/1993 | Grundy et al. | 364/488 |
| 5,224,056 | 6/1993 | Chene et al. | 364/490 |
| 5,231,588 | 7/1993 | Agrawal et al. | 364/489 |
| 5,231,589 | 7/1993 | Itoh et al. | 364/490 |
| 5,233,539 | 8/1993 | Agrawal et al. | 364/489 |
| 5,253,363 | 10/1993 | Hyman | 395/800 |
| 5,259,006 | 11/1993 | Price et al. | 375/107 |
| 5,329,470 | 7/1994 | Sample et al. | 364/578 |
| 5,329,471 | 7/1994 | Swoboda et al. | 364/578 |
| 5,339,262 | 8/1994 | Rostoker et al. | 364/578 |
| 5,352,123 | 10/1994 | Sample et al. | 439/61 |
| 5,386,550 | 1/1995 | Yumioka et al. | 395/575 |
| 5,425,036 | 6/1995 | Lui et al. | 371/23 |
| 5,437,037 | 7/1995 | Furuichi | 395/700 |
| 5,448,496 | 9/1995 | Butts et al. | 364/489 |
| 5,448,522 | 9/1995 | Huang | 365/189.04 |
| 5,452,231 | 9/1995 | Butts et al. | 364/489 |
| 5,452,239 | 9/1995 | Dai et al. | 364/578 |
| 5,475,830 | 12/1995 | Chen et al. | 395/500 |
| 5,477,475 | 12/1995 | Sample et al. | 364/578 |
| 5,479,355 | 12/1995 | Hyduke . | |
| 5,544,069 | 8/1996 | Mohsen . | |
| 5,546,562 | 8/1996 | Patel . | |
| 5,551,013 | 8/1996 | Beausoleil et al. . | |
| 5,563,829 | 10/1996 | Huang | 365/189.04 |
| 5,572,710 | 11/1996 | Asano et al. | 395/500 |
| 5,574,388 | 11/1996 | Barbier et al. | 326/41 |
| 5,596,742 | 1/1997 | Agrawal et al. | 395/500 |
| 5,612,891 | 3/1997 | Butts et al. | 364/489 |
| 5,748,875 | 5/1998 | Tzori | 395/183.05 |
| 5,841,967 | 11/1998 | Sample et al. | 395/183.09 |
| 5,872,953 | 2/1999 | Bailey | 395/500 |

OTHER PUBLICATIONS

Wirbel, "Plus Logic Rethinks PLD Approach," Newspaper Article, undated, one page.

Minnick, "A Programmable Cellular Array," undated, pp. 25–26.

Shoup, "Programmable Cellular Logic," Xerox Corp., Palo Alto Research Center, Palo Alto, CA, undated, pp. 27–28.

Schweikert, et al., "A Proper Model for the Partitioning of Electrical Circuits," Bell Telephone Laboratories, Inc., Murray Hill, New Jersey, undated, pp. 57–62.

Ayres, "Silicon Compilation—A Hierarchical Use of PLAs," Xerox Corp., El Segundo, CA, undated, pp. 314–326.

De Micheli, et al., Topological Partitioning of Programmable Logic Arrays, Department of Electrical Engineering and Computer Science, University of California at Berkeley, undated, pp. 182–183.

Clos, "A Study of Non–Blocking Switching Networks," The Bell System Technical Journal, vol. XXXII, Mar. 1953, pp. 126–144.

Minnick, "Cutpoint Cellular Logic," IEEE Transactions on Electronic Computers, Dec. 1964, pp. 685–698.

Spandorfer, "Synthesis of Logic Functions on an Array of Integrated Circuits," Contract Report AFCRL–66–298, UNIVAC Division of Sperry Rand Corp., Blue Bell, PA, Oct. 31, 1965.

Minnick, "Survey of Microcellular Research," Stanford Research Institute, Contract Report AFCRL–66–475, Jul. 1966.

Kautz, et al., "Cellular Interconnection Arrays," IEEE Transactions on Computers, vol. C–17, No. 5, May 1968, pp. 443–451.

Kautz, "Cellular Logic–in–Memory Arrays," IEEE Transaction on Computers, vol. C–18, No. 8, Aug. 1969, pp. 719–727.

Shoup, "Programmable Cellular Logic Arrays," Doctoral Thesis, Carnegie–Mellon University, DARPA Contract No. F44620–67–C0058, Mar. 1970.

Manning, "Automatic Test, Configuration, And Repair of Cellular Arrays," Doctoral Thesis MAC TR–151, MIT, Jun. 1975, pp. 1–243.

Horstmann, "Macro Test Circuit Generation," IBM Technical Disclosure Bulletin, vol. 18, No. 12, May 1976, pp. 4023–4029.

Brandsma, et al., "The Hardware Simulator: A Tool for Evaluating Computer Systems," IEEE Transactions on Computers, vol. C–26, No. 1, Jan. 1977, pp. 68–72.

Manning, "An Approach to Highly Integrated, Computer–Maintained Cellular Arrays," IEEE Transaction on Computers, vol. C–26, No. 6, Jun. 1977, pp. 536–552.

Masson, et al., "A Sampler of Circuit Switching Networks," Computer, Jun. 1979, pp. 145–161.

Anderson, "Restructurable VLSI Program," Semiannual Technical Summary Report to the Defense Advanced Research Projects Agency, Report No. ESD–TR–80–192, DARPA Contract No. F19628–80–C–0002, Mar. 31, 1980.

Snyder, "Introduction to the Configurable, Highly Parallel Computer," Report CSD–TR–351, Office of Naval Research Contracts N00014–80–K–0816 and N00014–81–K–0360, Nov. 1980.

"Switching Networks and Traffic Concepts," Chapter 36, Reference Data for Radio Engineers, Howard W. Sams & Co., 1981, pp. 36–1 to 36–16.

Payne, "Automated Partitioning of Hierarchically Specified Digital Systems," May 1981, pp. 1–132.

Preparata, et al., "The Cube–Connected Cycles: A Versatile Network for Parallel Computation," Communications of the ACM, vol. 24, No. 5, May 1981, pp. 300–309.

Feng, "A Survey of Interconnection Networks," Computer, Dec. 1981, pp. 12–27.

Kung, "Why Systolic Architectures?," Computer, Jan. 1982, pp. 37–46.

Pfister, "The Yorktown Simulation Engine: Introduction," $19^{th}$ Design Automation Conference Proceedings, Paper 7.1, Jun. 14–16, 1982, pp. 51–54.

Denneau, "The Yorktown Simulation Engine," $19^{th}$ Design Automation Conference Proceedings, Paper 7.2, Jun. 14–16, 1982, pp. 55–59.

Krondstadt, et al., "Software Support for the Yorktown Simulation Engine," $19^{th}$ Design Automation Conference Proceedings, Paper 7.3, Jun. 14–16, 1982, pp. 60–64.

Abramovici, et al., "A Logic Simulation Machine," $19^{th}$ Design Automation Conference Proceedings, Paper 7.4, Jun. 14–16, 1982, pp. 65–73.

Fiduccia, et al., "A Linear–Time Heuristics for Improving Network Partitions," $19^{th}$ Design Automation Conference Proceedings, Paper 13.1, Jun. 14–16, 1982, pp. 175–181.

Hedlund, "Wafer Scale Integration of Parallel Processors," Doctoral Thesis, Office of Naval Research Contracts N00014–80–K–0816 and N00014–81–K–0360, Dec. 1982, pp. 1–248.

Wagner, "The Boolean Vector Machine (BVM)", ACM SIGARCH, 1983, pp. 59–66.

Palesko, "Logic Partitioning for Minimizing Gate Arrays," IEEE Transactions on Computer–Aided Design of Integrated Circuits and Systems, vol. CAD–2, No. 2, Apr. 1983, pp. 117–121.

Gentile, et al., "Design of Switches for Self–Reconfiguring VLSI Array Structures," Microprocessing and Microprogramming, North Holland, 1984, pp. 99–108.

Sami, et al., "Reconfigurable Architectures for VLSI Processing Arrays," AFIPS Conference Proceedings, 1983 National Computer Conference, May 16–19, 1983, pp. 565–577.

Dussault, et al., "A High Level Synthesis Tool for MOS Chip Design," $21^{st}$ Design Automation Conference Proceedings, Paper 20.1, 1984, pp. 308–314.

Hedlund, et al., "Systolic Architecture–A Wafer Scale Approach, "IEEE, 1984, pp. 604–610.

Krishnamurthy, "An Improved Min–Cut Algorithm for Partitioning VLSI Networks," IEEE Transactions on Computers, vol C–33, No. 5, May 1984, pp. 438–446.

Dunlop, et al., "A Procedure for Placement of Standard–Cell VLSI Circuits," IEEE Transactions on Computer Aided Designs, vol. CAD–4, No. 1, Jan. 1985, pp. 92–98.

Siegel, et al., "The Design of a Logic Simulation Accelerator," VLSI Systems Design, Oct. 1985, pp. 76–80.

Koike, "HAL: A High–Speed Logic Simulation Machine," IEEE Design & Test, Oct. 1985, 61–73.

"Partitioning of PLA Logic," IBM Technical Disclosure Bulletin, vol. 28, No. 6, Nov. 1985, pp. 2332–2333.

Hartoog, "Analysis of Placement Procedures for VLSI Standard Layout," $23^{rd}$ Design Automation Conference Proceedings, Paper 16.4, 1986, 314–319.

Goossens, et al., "A Computer–Aided Design Methodology for Mapping DSP–Algorithms onto Custom Multiprocessor Architectures," IEEE, 1986, pp. 924–925.

Choi, et al., "Fault Diagnosis of Switches in Wafer–Scale Arrays," IEEE, 1986, pp. 292–295.

Chen, et al., "Fault–Tolerant Wafer Scale Architectures Using Large Crossbar Switch Arrays," excerpt from Jesshope, et al., Wafer Scale Integration, A. Hilger, 1986, pp. 113–124.

Ravenscroft, et al., "Functional Language Extractor and Boolean Cover Generator," IEEE, 1986, pp. 120–123.

Rosenstiel, "Optimizations in High Level Synthesis," Microprocessing and Microprogramming, 1986, pp. 347–352.

Carter, et al., "A User Programmable Reconfigurable Logic Array," IEEE 1986 Custom Integrated Circuits Conference, pp. 233–235.

"The Programmable Gate Array Design Handbook," Xilinx, First Edition, 1986, pp. 1–1 to 4–33.

Donnell, "Crosspoint Switch: A PLD Approach," Digital Design, Jul. 1986, 40–44.

Wynn, "In–Circuit Emulation for ASIC–Based Design," VLSI Systems Design, Oct. 1986, pp. 38–45.

Beresford, "Hard Facts, Soft ASICs," VLSI Systems Design, Dec. 1986, pp. 8.

Malik, et al., "Combining Multi–Level Decomposition and Topological Partitioning for PLAs," IEEE, 1987, pp. 112–115.

"Gate Station Reference Manual," Mentor Graphics, Corp., excerpts, 1987.

"Gate Station User's Manual," Mentor Graphics, Corp., excerpts, 1987.

"The Homogeneous Computational Medium: new Technology for computation," Concurrent Logic, Inc., Jan. 26, 1987, pp. 1–4.

McClure, "PLD Breadboarding of Gate Array Designs," VLSI Systems Design, vol. 8, No. 2, Feb. 1987, pp. 36–41.

Chin, et al., "A Dynamically Reconfigurable Interconection Chip," 1987 IEEE International Solid–State Circuits Conference, Digest of Technical Papers, First Edition, Feb. 27, 1987, pp. 276–277, 425.

Trickey, "Flamel: A High–Level Hardware Compiler," IEEE Transaction on Computer–Aided Design, vol. CAD–8, No. 2, Mar. 1987, pp. 259–269.

Shear, "Tools Help You Retain the Advantages of Using Breadboards in Gate–Array Design," EDN, Mar. 18, 1987, pp. 81–88.

Odawara, "Partitioning and Placement Techniques for CMOS Gate Arrays," IEEE Transactions on Computer–Aided Design, vol. CAD–6, No. 3, May 1987, pp. 355–363.

Beresford, "An Emulator for CMOS ASICs," VLSI Systems Design, May 4, 1987, pp. 8.

Schmitz, "Emulating of VLSI Devices Using LCAs," VLSI Systems Design, vol. 8, No. 6, May 20, 1987, pp. 54–62.

McCarthy, "Partitioning Adapts Large State Machines to PLDs," EDN, Sep. 17, 1987, pp. 163–166.

Munoz, et al., "Automatic Partitioning of Programmable Logic Devices," VLSI Systems Design, Oct. 1987, pp. 74–86.

Tham, "Parallel Processing for CAD Applications," IEEE Design & Test of Computers, Oct. 1987, 13–17.

Agrawal, et al., "Mars: A Multiprocessor–Based Programmable Accelerator," IEEE Design & Test of Computers, Oct. 1987, pp. 28–36.

Hou, et al., "A High Level Synthesis Tool for Systolic Designs," IEEE, 1988, pp. 665–673.

"The Programmable Gate Array Data Book," Xilinx, Inc., 1988.

Beece, et al., "The IBM Engineering Verification Engine," $25^{th}$ ACM/IEEE Design Automation Conference, Jun. 12–15, 1988, Paper 17.1, pp. 218–224.

McFarland, et al., "Tutorial on High–Level Synthesis," $25^{th}$ ACM/IEEE Design Automation Conference, Jun. 12–15, 1988, Paper 23.1, pp. 330–336.

Borriello, et al., "High–Level Synthesis: Current Status and Future Directions," $25^{th}$ ACM/IEEE Design Automation Conference, Jun. 12–15, 1988, Paper 32.1, pp. 477–482.

De Micheli, et al., "Hercules—A System for High–Level Synthesis," $25^{th}$ ACM/IEEE Design Automation Conference, Jun. 12–15, 1988, Paper 32.2, pp. 483–488.

Runner, et al., "Synthesizing Ada's Ideal Machine Mate," VLSI Systems Design, Oct. 1988, pp. 30–39.

Kahng, "Fast Hypergraph Partition," $26^{th}$ ACM/IEEE Design Automation Conference, 1989, Paper 43.2, pp. 762–766.

Wei, et al., "Towards Efficient Hierarchical Design by Ration Cut Partitioning," IEEE, 1989, pp. 298–301.

"ERA60100, Electrically Reconfigurable Array–ERA," Brochure by Plessey Semiconductors, Apr. 1989, pp. 1–16.

Garbers, et al., "Finding Clusters in VLSI Circuits," IEEE, 1990, pp. 520–523.

Agrawal, et al., "A Hardware Logic Simulation System," IEEE Transactions on Computer Aided Designs, vol. 9, No. 1, Jan. 1990, pp. 19–29.

McFarland, et al., "The High–Level Synthesis of Digital Systems," Proceedings of the IEEE, vol. 78, No. 2, Feb. 1990, pp. 301–316.

Yeh, et al., "A General Purpose Multiple Way Partitioning Algorithm," $28^{th}$ ACM/IEEE Design Automation Conference, Jun. 17–21, 1991, Paper 25.1, pp. 421–426.

Wei, et al., "Ration Cut Partitioning for Hierarchical Designs," IEEE Transactions on Computer–Aided Design, vol. 10, No. 7, Jul. 1991, pp. 911–921.

Babb, et al, "Virtual Wires: Overcoming Pin Limitations in FPGA–based Logic Emulations," IEEE, 1993, pp. 142–151.

EPO Search Report, Mar. 4, 1998.

```verilog
MODULE EXAMPLE(CLK, SELECT, MASK, IRQ, INTRPT, VECTOR);
INPUT CLK, SELECT;
INPUT [0:7]MASK, IRQ;
OUTPUT INTRPT;
OUTPUT[0:2]VECTOR;

REG [0:2]VECTOR;
REG INTRPT;
WIRE[0:7]MASKSTORE;
INTEGER I;

Q_AN02 U1(CM, CLK, SELECT);
Q_FDP0 M0(.Q(MASKSTORE[0]), .C(CM), .D(MASK[0]));
Q_FDP0 M1(.Q(MASKSTORE[1]), .C(CM), .D(MASK[1]));
Q_FDP0 M2(.Q(MASKSTORE[2]), .C(CM), .D(MASK[2]));
Q_FDP0 M3(.Q(MASKSTORE[3]), .C(CM), .D(MASK[3]));
Q_FDP0 M4(.Q(MASKSTORE[4]), .C(CM), .D(MASK[4]));
Q_FDP0 M5(.Q(MASKSTORE[5]), .C(CM), .D(MASK[5]));
Q_FDP0 M6(.Q(MASKSTORE[6]), .C(CM), .D(MASK[6]));
Q_FDP0 M7(.Q(MASKSTORE[7]), .C(CM), .D(MASK[7]));
ALWAYS @(NEGEDGE CLK)
    BEGIN : LINE_SELECT
        INTRPT = 0;
        FOR (I = 0; I<8 && INTRPT == 0; I = I+1)
            BEGIN
                IF(IRQ[I] & MASKSTORE[I])
                    BEGIN
                        VECTOR = I;
                        INTRPT = 1;
                    END
            END
    END

ENDMODULE
```

FIG. 14

```
WHILE(1)
    SWITCH (*EVENT_ADDR) {
        CASE 1:
            . . .

CASE 5:
            FOR (I=0; I<8 &&INTRPT==0; ++I)
                IF (IRQ[I]&MASKSTORE[I]) {
                    INTRPT = 1;
                    SET_VALUE (INTRPT, 1);
                    SET_VALUE(VECTOR[0], I&1);
                    SET_VALUE(VECTOR[1], (I&2)>>1);
                    SET_VALUE(VECTOR[1], (I&4)>>2;
                }
            BREAK;
        CASE 6:
            . . .
    }
```

FIG. 17

METHOD AND APPARATUS FOR DESIGN VERIFICATION USING EMULATION AND SIMULATION

This is a continuation of application Ser. No. 08/733,352 filed Oct. 17, 1996, which will issue as U.S. Pat. No. 5,841,967 on Nov. 24. 1998.

FIELD OF THE INVENTION

The present invention relates to combining emulation and simulation to verify a logic design.

BACKGROUND OF THE INVENTION

Emulation systems provide circuit and system designers powerful methods to functionally test out systems and integrated circuits before committing them to production. Circuit designers and engineers use emulators to convert a design into temporary operating hardware, thus enabling the engineer to test the design at or near real time conditions. Additionally, the engineer can concurrently verify the integrated circuits, system hardware and software. Examples of emulation systems are described in U.S. Pat. No. 5,109,353 to Sample et al. and U.S. Pat. No. 5,036,473 to Butts et al., both of which are incorporated by reference.

Typically, the design process involves multiple transformations of a design from the initial design idea level to the detailed manufacturing level. An engineer may start with a design idea. The engineer may then generate a behavioral definition of the design idea. The product of the behavioral design may be a flow chart or a flow graph. Next, the engineer may design the system data path and may specify the registers and logic units necessary for implementation of the system. At this stage, the engineer may establish the procedure for controlling the movement of data between registers and logic units through buses. Logic design is the next step in the design process whereby the engineer uses primitive gates and flip-flops for the implementation of data registers, buses, logic units, and their controlling hardware. The result of this design stage is a netlist of gates and flip-flops.

The next design stage transforms the netlist of gates and flip-flops into a transistor list or layout. Thus, gates and flip-flops are replaced with their transistor equivalents or library cells. During the cell and transistor selection process, timing and loading requirements are taken into consideration. Finally, the design is manufactured, whereby the transistor list or layout specification is used to burn fuses of a programmable device or to generate masks for integrated circuit fabrication.

Hardware description languages ("HDLs") provide formats for representing the output of the various design stages described above. These languages can be used to create circuits at various levels including gate-level descriptions of functional blocks and high-level descriptions of complete systems. Thus, HDLs can describe electronic systems at many levels of abstraction.

Hardware description languages are used to describe hardware for the purposes of simulation, modeling, testing, creation and documentation of designs. Previously, circuit designers tended to design at the logic gate level. Increasingly, designers are designing at higher levels, particularly using HDL methodology. HDLs provide a convenient format for the representation of functional and wiring details of designs and may represent hardware at one or more levels of abstraction.

Two popular hardware description languages are Verilog and Very-High-Speed Integrated Circuit (VHSIC) Hardware Description Language ("VHDL"). VHDL began in the early 1980s within the United States Department of Defense and it was intended initially to be a documentation language for the description of digital hardware systems. Later, the language was refined so that descriptions could be simulated and synthesized. The advent of HDL-based design tools including design entry, simulation and synthesis has subsequently shifted VHDL's focus from design documentation to high-level design. Other hardware description languages include, but are not limited to, A Hardware Programming Language ("AHPL"), Computer Design Language ("CDL"), CONsensus LANguage ("CONLAN"), Interactive Design Language ("IDL"), Instruction Set Processor Specification ("ISPS"), Test Generation And Simulation ("TEGAS"), Texas Instrument Hardware Description Language ("TI-HDL"), Toshiba Description Language ("TDL"), ZEUS, and NDL.

Simulation has long been a preferred method for verification of logical correctness of complex electronic circuit designs. Simulation is broadly defined as the creation of a model which, if subjected to arbitrary stimuli, responds in a similar way to the manufactured and tested design. More specifically, the term "simulation" is typically used when such a model is implemented as a computer program. In contrast, the term "emulation" is the creation of a model using programmable (also known as reconfigurable) logic or field-programmable gate array (FPGA) devices. Simulation saves a significant amount of time and financial resources because it enables designers to detect design errors before the expensive manufacturing process is undertaken. Moreover, the design process itself can be viewed as a sequence of steps where the initial general concept of a new product is being turned into a detailed blueprint. Detecting errors at the early stages of this process also saves time and engineering resources.

Simulators can be divided into two types. One type of simulator follows levelized simulation principles, and a second type follows event-driven simulation principles. Levelized simulators, at each simulation cycle, have to reevaluate the new state of every component of the simulated design, whether or not the input signals of the component have changed. Additionally, the component's state has to be retransmitted even if the state has not changed. Event-driven simulators only evaluate those components for which some input conditions are changing in the current simulation cycle. Consequently, event-driven simulators achieve considerable savings in component evaluation time. However, significant additional software runtime is spent on the decision-making of whether a particular component should be evaluated. As a result, both types of prior simulators (levelized and event-driven) have similar performances.

The primary advantage of emulation over simulation is speed. Emulation maps every component under verification into a physically different programmable logic device, and therefore all such components are verified in parallel. In a typical simulator, however, the single processing element serially computes the next state of each component at every simulation time step.

Emulation is an efficient verification technology for designs represented as or easily converted to a network of logic gates. Modem design methodology, however, requires that at the initial design stages, large design portions are represented by behavioral models. Through a series of design decisions these behavioral models are gradually replaced with equivalent structural representations. Correctness of each replacement step is subject to verification, at which point the design presents itself as a complicated mix of behavioral, structural, and gate-level components. Structural parts of the design can be directly mapped into emulation hardware using widely available logic synthesis programs. Behavioral portions, however, can only be compiled into computer programs and executed. By its nature, emulation requires creation of a model using actual hardware and therefore cannot be used at the early stage of the design cycle when the concept of a new product is not yet represented by its components but rather by a high-level description of its functions. Therefore, to conduct verification at earlier design stages, the most appropriate environment would efficiently combine the features of emulation and behavioral simulation. Furthermore, combining emulation and simulation enables a designer to simulate design components that cannot be emulated because of physical constraints such as analog signals.

As the design approaches completion, emphasis naturally shifts away from behavioral simulation and towards logic emulation. However, the parts that represent the operating environment of the future product may never be converted to a structural representation. In this case, the behavioral description of the system-level environment serves as a test bench for the emulated design. The system-level behavioral description generates test stimulus and evaluates the responses of the design under verification in a way that closely replicates the real operating conditions. The need to execute such behavioral test benches is another motivation for combining the simulation and the emulation capabilities in one logic verification system.

One approach to combining emulation and simulation is to run a simulator on a host workstation (or network thereof) communicating the events or changes in signal state to and from the emulated portion of the design over a network interface. However, in such a solution, the speed of event transfer seriously limits performance. Experiments show that the average time to transfer a 4-byte data packet over transport control protocol ("TCP") running on a SUN workstation computer (e.g., a SPARC-20) is around 50 microseconds. Assuming that a data packet of such size is used for encoding an event and given average design activity of 1000 events per simulation cycle, the speed of simulation will be limited to 20 cycles per second. Therefore, there currently exists a need for combining emulation and simulation to efficiently verify circuit designs that may be a mixture of gate-level, structural and behavioral representations.

SUMMARY OF THE INVENTION

Accordingly, a general object of the present invention is to provide an apparatus and method for efficiently coupling simulation and emulation of a logic design, so that the overhead of event transfer between the simulated and the emulated design portions is minimized.

In order to achieve the above object, the design verification method and apparatus includes at least one reconfigurable device that is used to emulate a portion of the logic design under verification. Additionally, at least one microprocessor is used to simulate another design portion which may be represented as a behavioral description. The microprocessor is connected to the reconfigurable device in a manner that minimizes data transfer time between the simulated and emulated portions. Furthermore, an event detector is provided to detect events during verification of the design. The microprocessor is relieved from performing such event detection functions, thereby reducing design verification time.

Additional objects, advantages, and features of the present invention will further become apparent to persons skilled in the art from the study of the following description and drawings.

BRIEF DESCRIPTION OF THE DRAWINGS

FIG. 14 illustrates an example of a logic design represented partially by component interconnection, and partially by behavioral description, using a code fragment in Verilog hardware description language.

FIG. 17 illustrates an example of executable code (in 'C' programming language) created by the code generation step 144 (step shown in FIG. 13).

DESCRIPTION OF THE PREFERRED EMBODIMENT

Figure 1:
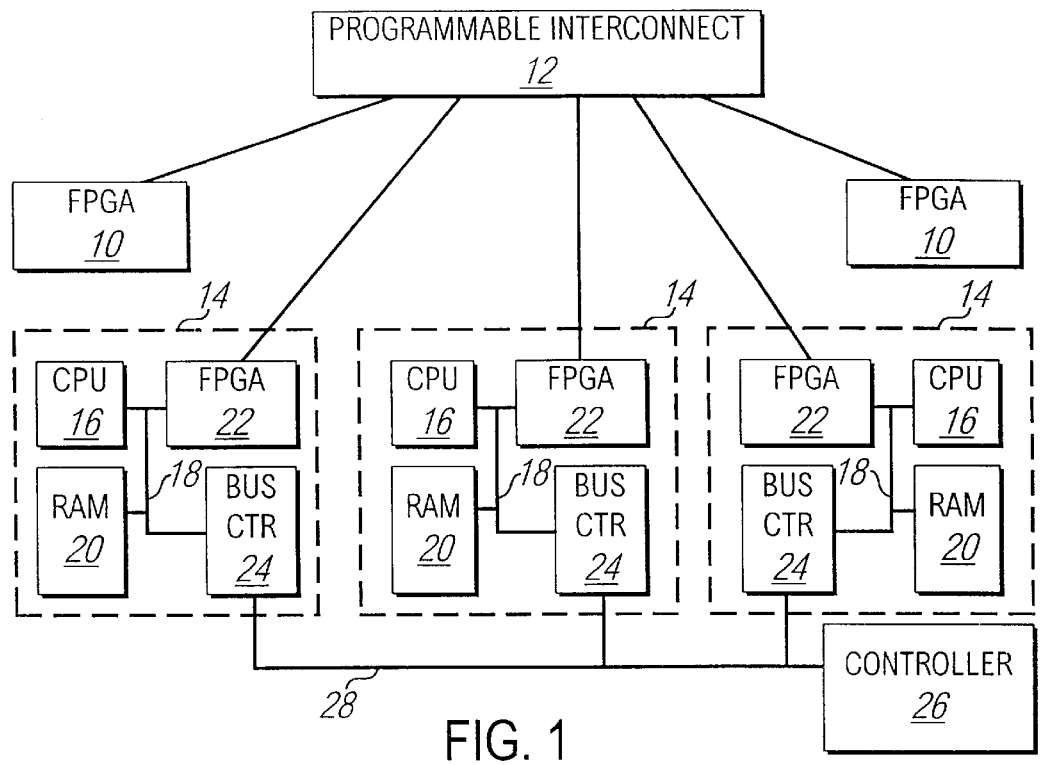
FIG. 1 is a block diagram of one embodiment of a logic verification system with multiple processors and programmable gate array devices.

FIG. 1 shows the preferred embodiment of the logic verification system. The system includes one or more reconfigurable logic components which may be programmable gate array ("FPGA") devices 10 interconnected using the programmable interconnect 12. The interconnect 12 can be programmed to create an arbitrary connection between any number of inputs or outputs of the devices connected to it. The apparatus also includes one or more simulation modules 14 (for exemplary purposes only, three are shown). Each of the simulation modules 14 includes a microprocessor 16, connected through a microprocessor bus 18 to one or more random access memory devices 20, one or more reconfigurable logic components which may be FPGAs 22, and a system bus controller 24. Although FIG. 1 only shows one random access memory device 20, and one FPGA 22, one of skill in the art would understand that any number of memory devices 20 or FPGAs 22 could be employed. Furthermore, any type of memory could be utilized to similarly perform the functions of random access memory 20. In addition, other types of reconfigurable logic components such as PALs or PLAs could perform the function of FPGAs 10, 22. Which type of FPGA to use is purely a matter of the designer's choice. In the preferred embodiment, 4036EX devices from Xilinx, Inc. are used. These devices are described in The Programmable Logic Data Book from Xilinx dated June 1996, PN 0010303 which is incorporated by reference. Which CPU 16 to use is also purely a matter of the designer's choice. In the preferred embodiment, the PPC403GC CPU chip from IBM, Inc. is used. Each of the FPGA devices 22 in each simulation module 14 is also connected to programmable interconnect 12.

FPGA devices 10 emulate the logic circuit portions under verification represented as the interconnection of components, as disclosed in Butts et al., U.S. Pat. No. 5,036,473. Simulation modules 14 simulate the logic circuit portions under verification which may be represented by behavioral descriptions. Inside these modules 14, the microprocessors 16 selectively execute fragments of the behavioral description. The hardware logic implemented in FPGA 22 selects the behavioral fragments to be executed and the order of execution. Unlike the event-driven simulators known in the prior art, the microprocessors 16 are relieved from the functions of detecting, scheduling, and ordering the events. As a result, simulation speed is dramatically improved. FPGA devices 22 also communicate the signal values shared between the behavioral description portion and those design portions represented by the interconnection of components. Additionally, FPGAs 22 communicate the signal values shared between different simulation modules 14.

It is not integral to the present invention that the FPGA devices 22 do not emulate logic circuit portions represented as the component interconnections. Similarly, it is not integral to the current invention that the FPGA devices 10 do not implement the logic that determines the selection and order of the behavioral code fragments for execution by the microprocessors 16. Rather, in its preferred embodiment, the present invention allows for arbitrary distribution of the hardware logic used for any of these purposes among the FPGA devices 10 and the FPGA devices 22. Although for sake of simplicity FPGA devices 22 are employed, it is understood to one of skill in the art that the FPGA devices 10 could be similarly employed.

The system bus controllers 24 are connected to the system controller 26 through the system bus 28. The system controller 26 performs the functions of downloading configuration data into the FPGA devices 10, 22, downloading the executable data into the random access memory devices 20, starting the logic verification system, communicating data between the logic verification system and the host workstation (not shown). The system controller 26 is implemented using a commercial embedded controller board or by any other means known to those skilled in the art.

Random access memory devices 20 store the behavioral code fragments, and the values of the simulation variables that are not shared between the behavioral description portions and the component interconnection portions, or between multiple simulation modules 14. System bus controllers 24 communicate data to and from the system controller 26 through the system bus 28. The logic verification system permits programming of configuration data for the FPGA devices 10, 22 and programmable interconnect 12. Also, executable software code fragments are downloaded into the random access memory devices 20. Such programming may be implemented as a computer program and executed on a computer workstation.

Figure 2:
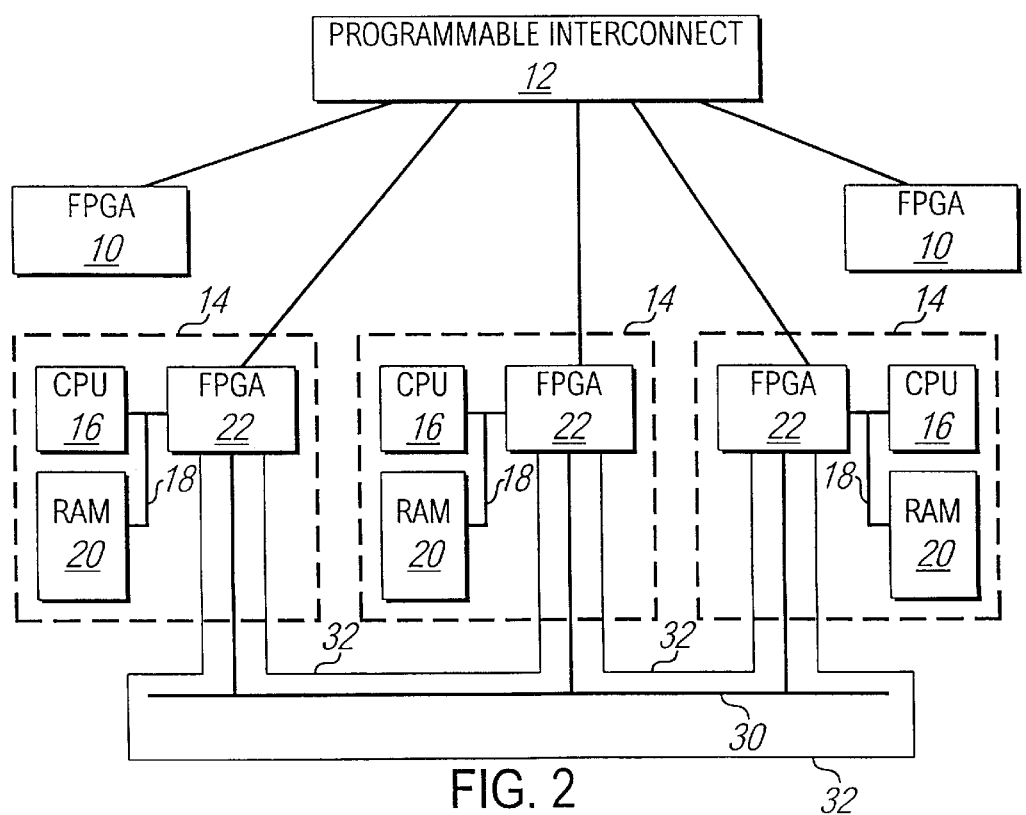
FIG. 2 is a block diagram of another embodiment of a logic verification system which includes a global-event-transfer bus.

An alternative embodiment of the logic verification system is shown in FIG. 2. This embodiment further includes a global-event-communication bus that comprises a plurality of signal lines 30 connected in parallel to all FPGA devices 22, and a daisy chain line 32 that connects all FPGA devices 22 serially. Note that this embodiment would also include system bus controllers 24, a system controller 26 and a system bus 28 as shown in FIG. 1. These components are omitted in FIG. 2 to simplify the drawing. The global-event-communication bus is included because the programmable interconnect 12 constitutes a limited and expensive resource. Rather than routing the signals shared between the multiple simulation modules 14 through programmable interconnect 12, such signals can be communicated in a serial fashion, one signal at a time, over the global-event-communication bus. The simulation module 14, that serves as a transmitter of a new signal value, sets some of the signal lines 30 to represent the serial number of such signal and its new value. This information reaches all other simulation modules 14 and is captured as necessary.

In the case where several simulation modules 14 serve as transmitters at the same time, the order needs to be imposed in which they take control of the signal lines 30. To accomplish this ordering, the daisy chain line 32 is operated according to the token ring principle. At any given moment a token represented by a value on the input portion of daisy chain line 32 resides with one of the simulation modules 14, giving that module 14 the right to control the signal lines 30. After finishing its transmission, the simulation module 14 surrenders the token to the next module along the daisy chain line 32 and so on.

In addition to transmitting the signals shared between simulation modules 14, the global-event-communication bus also transmits the signals that synchronize the operation of simulation modules 14. Examples of such synchronization signals include the simulation time advancement signal, and the BUSY signals indicating that the simulation modules 14 still have some number of events to be processed in the current simulation cycle.

While executing the behavioral description fragments, the microprocessors 16 need to set the new values to the variables that describe the current state of the logic design being simulated. Those variables that are locally used in only one simulation module 14 are represented by appropriate locations in the random access memory device 20.

Figure 3:
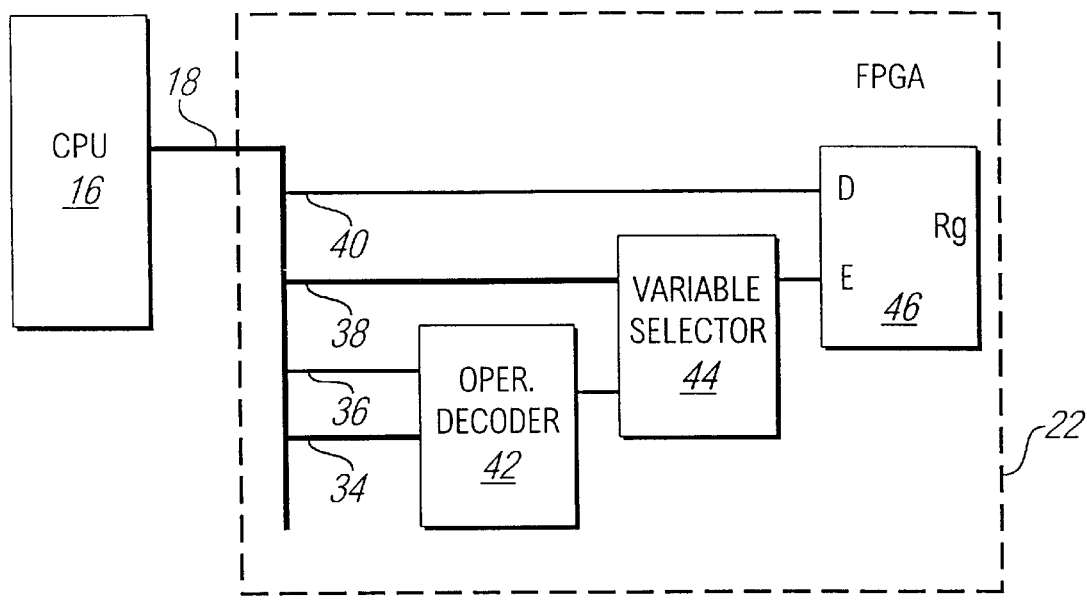
FIG. 3 is a block diagram showing the transmission of computed values of variables from the simulated design portion into the emulated design portion.

Those variables, however, that are shared between the behavioral description portions and component interconnection portions, and those that are shared between multiple simulation modules 14 must be transmitted outside of a simulation module 14. FIG. 3 illustrates such transmission where the microprocessor bus 18 is split into a plurality of address lines 34, a bus operation (read or write) line 36, a plurality of data lines 38 representing the code that uniquely identifies the variable being transmitted (also known as "variable ID"), and the data line 40 representing the new value of such variable. Upon execution of an i/o instruction, the microprocessor 16 installs appropriate signal values on lines 34 through 40 which together constitute the microprocessor bus 18. A certain unique combination of values on lines 34 and 36 indicates to the operation decoder 42 that the microprocessor 16 will transmit a new value of some variable. In response, the operation decoder 42 enables the variable selector 44 which then recognizes the combination of values on lines 38 as indicative of a particular variable. In response, the variable selector 44 enables the register 46 that captures the new variable value from the line 40.

Figure 4:
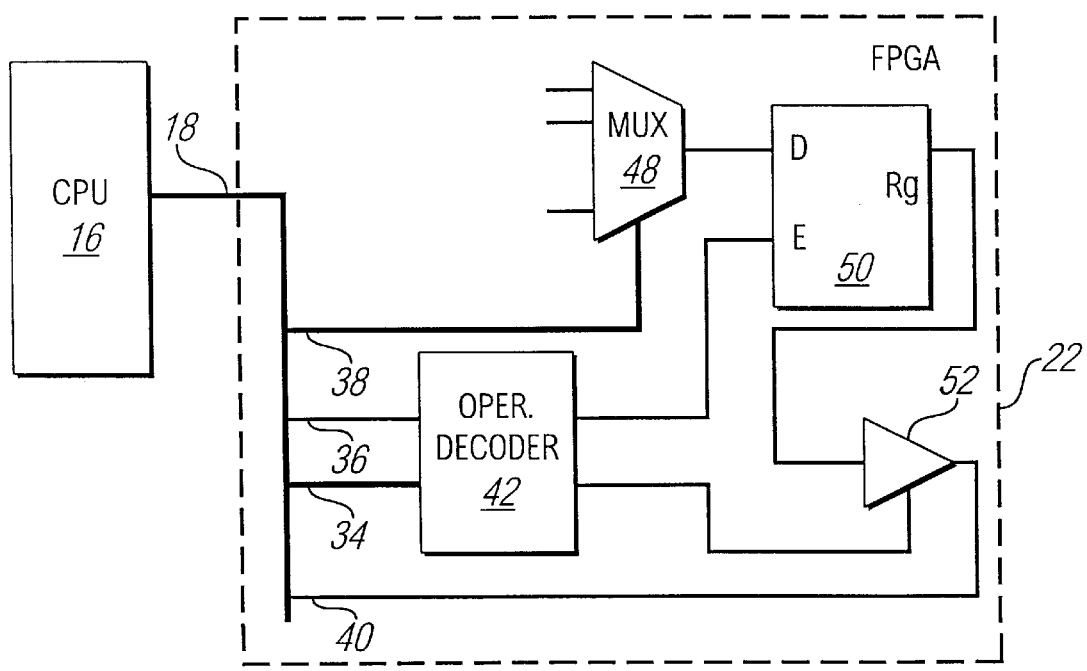
FIG. 4 is a block diagram showing the capture of computed values of variables from the emulated design portion into the simulated design portion.

Similarly, in the course of executing the behavioral description fragments the microprocessors 16 need to capture the new variable values that describe the current state of the logic design being simulated. Those variables that are locally used in only one simulation module 14 are represented by appropriate locations in the random access memory device 20. Those variables that are shared between the behavioral description portions and the component interconnection portions, and those shared between multiple simulation modules 14 must be captured from outside of the simulation module 14. FIG. 4 illustrates such capture where FPGA 22 additionally includes a multiplexer 48, an intermediate register 50, and a bus driver 52.

The capture operation proceeds in two steps and takes two microprocessor instructions to complete. In the first step a write operation is performed. The operation decoder 42 recognizes a combination of an address on lines 34 and a bus operation on line 36 as indicative of the microprocessor's intent to start the capture of a variable value. In response, the operation decoder 42 enables a register 50 which in turn captures the variable value selected by the multiplexer 48 based on the variable ID on lines 38.

In the second step a read operation is performed. The operation decoder 42 recognizes a combination of an address on lines 34 and a bus operation on line 36 as indicative of the microprocessor's intent to complete the capture of a variable value. Next, the operation decoder 42 enables a bus driver 52 that transmits the variable value from the output of register 50 and onto the line 40 of the microprocessor bus 18.

Figure 5:
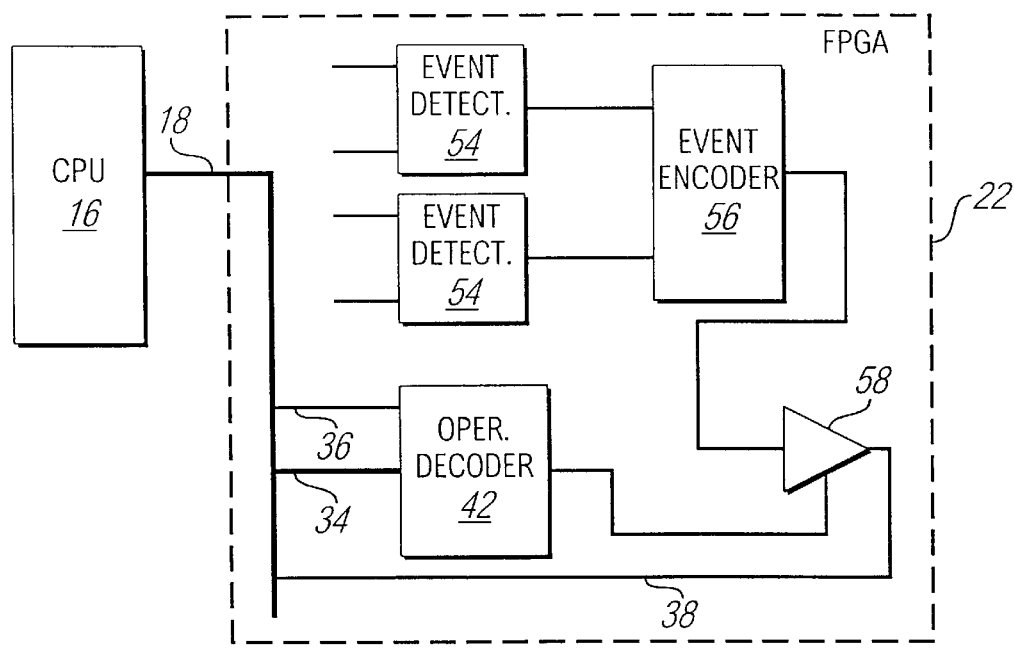
FIG. 5 is a block diagram showing the computation of event codes and their transfer to the microprocessor performing behavioral simulation.

As discussed earlier, the hardware logic implemented in FPGAs 10 and 22 select and order the behavioral code fragments for execution by the microprocessors 16. One embodiment of such logic is shown in FIG. 5. The embodiment contains one or more event detectors 54 (for exemplary purposes, two are shown), an event encoder 56, and a bus driver 58. Each event detector 54 independently produces a signal that triggers the execution of one particular fragment of behavioral code by the microprocessor 16. That signal is fed into an event encoder 56 that provides a code (known as an "event ID") at its output that uniquely identifies its input signal that has been set.

If two or more inputs to the event encoder 56 are set at the same time, it produces the ID of the event that has preference in the behavioral code fragments execution order. For example, it could be the event which has a smaller event ID value.

When the microprocessor 16 is ready for execution of the next behavioral fragment, it performs a read operation. The operation decoder 42 recognizes a combination of an address on lines 34 and a bus operation on line 36 as indicative of the intent of the microprocessor to capture the ID of the next behavioral code fragment to be executed. In response, the operation decoder enables a bus driver 58 that transmits the event ID from the output of event encoder 56 onto the lines 38 of the microprocessor bus 18. When none of the event detectors 54 produce a signal requesting the execution of a behavioral code fragment, the event encoder 56 produces an output signal indicating to the microprocessor 16 that no operation is required at this time. The appearance of the output signal at the output of at least one of the event detectors 54 can, in one embodiment, cause an interrupt operation of the microprocessor 16.

After transmitting the event ID to the microprocessor 16, the event encoder 56 automatically resets the corresponding event detector 54. The reset circuit is not shown in the drawings but is well known in the art, and can be readily reproduced by one skilled in the art.

Figure 6:
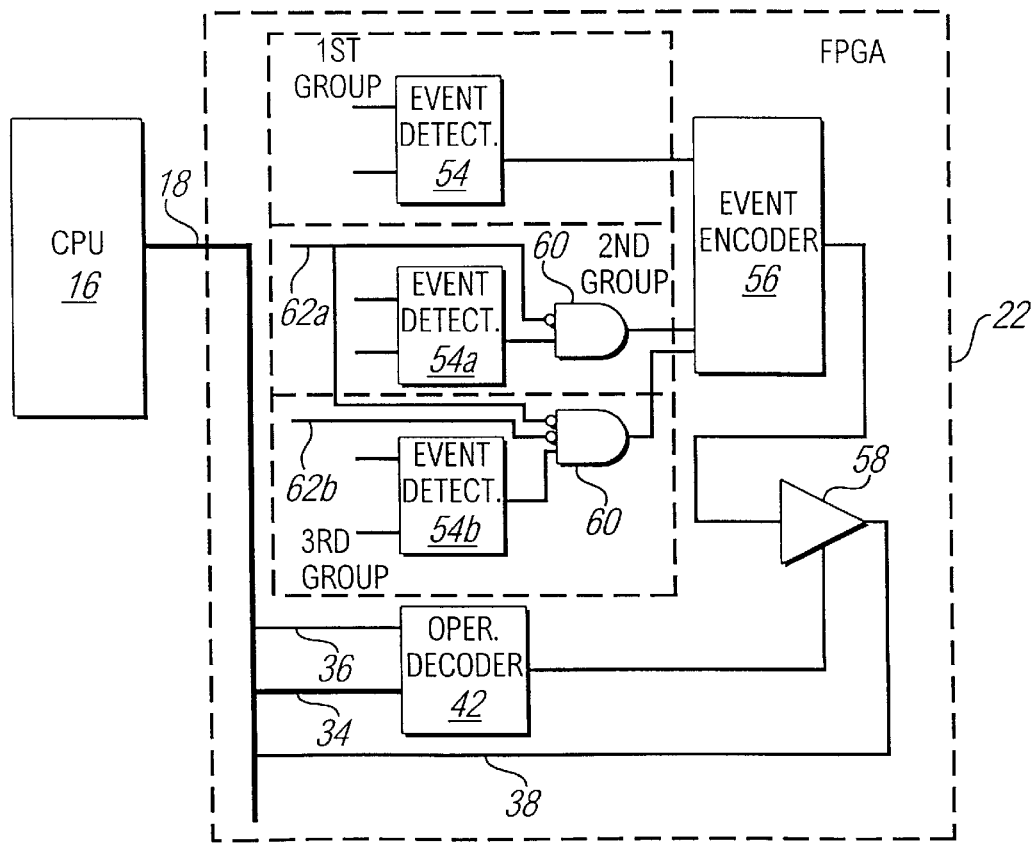
FIG. 6 is a block diagram of another embodiment showing the computation of the event codes and their transfer to the microprocessor performing behavioral simulation where events are grouped into, for example, active events, inactive events, non-blocking assign update events, and monitor events.

Another embodiment of the event ID computation logic is shown in FIG. 6. In this embodiment the event detectors 54 are grouped according to scheduling requirements of the behavioral model. For example, for models written in Verilog hardware description language such requirements are defined by chapter 5 of the I.E.E.E. Draft Standard 1364. Particularly, Verilog models require that all events processed in the same simulation cycle be grouped into four groups, namely the active events, the inactive events, the non-blocking-assign-update events, and the monitor events. Verilog models further require that any active events are processed before any inactive events which in turn are processed before any non-blocking-assign-update events which in turn are processed before any monitor events.

To conform to these requirements, the embodiment shown in FIG. 6 comprises a plurality of groups of event detectors. Each group has one or more event detectors 54 (for example, one is shown in each group) and an AND gate 60, except that the first group does not contain such AND gate 60. The AND gate 60 that belongs to the second group is controlled by BUSY[1] signal 62a indicating there are unprocessed events in the first group. Similarly, the AND gate 60 of the third group is controlled by BUSY[1] signal 62a and by BUSY[2] signal 62b, the latter indicating that there are still unprocessed events in the second group. As a result, the signal from an event detector 54a that belongs to the second group will reach event encoder 56 only if there are no outstanding events in the first group. Similarly, the signal from an event detector 54b that belongs to the third group will reach event encoder 56 only if there are no outstanding events in the first or the second groups. The pattern continues for the fourth and further groups utilizing more of the BUSY signals 62 as necessary.

Figure 7:
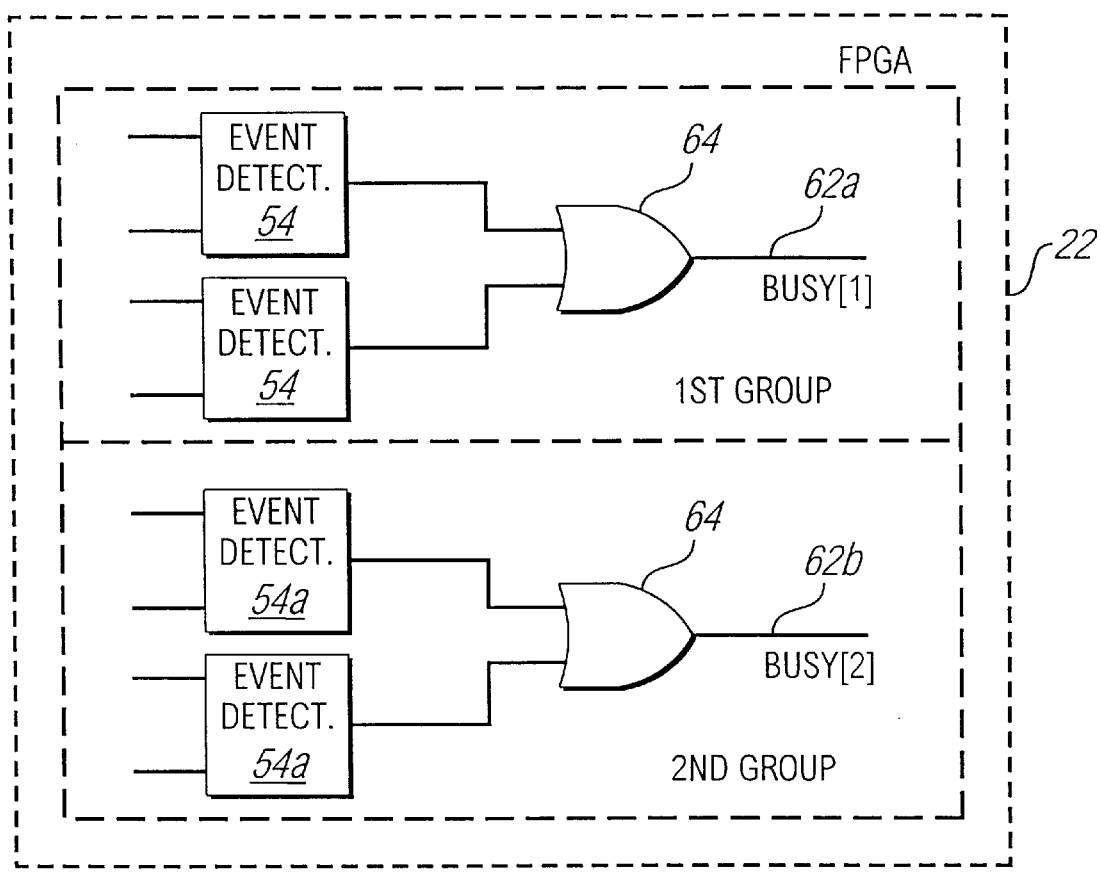
FIG. 7 is a block diagram showing the detection of outstanding events in the event groups.

The formation of the BUSY signals 62 is shown in FIG. 7. Each BUSY signal 62 is formed as a logic OR function 64 of the output signals of all event detectors 54 that belong to the corresponding group. Specifically, BUSY[1] signal 62a is formed using the event detectors of the first group, BUSY[2] signal 62b is formed using the event detectors of the second group, and so on. It has to be appreciated that outputs from all event detectors 54 within a group from all simulation modules 14 must be OR'ed together to form a BUSY signal 62. In one embodiment of the present invention, wired logic is used to form a BUSY signal 62, so that the OR function 64 is implicitly implemented as a wire. In yet another embodiment, some of the global-event-communication bus lines 30 are used to propagate the BUSY signals 62 among all of the simulation modules 14.

Figure 8:
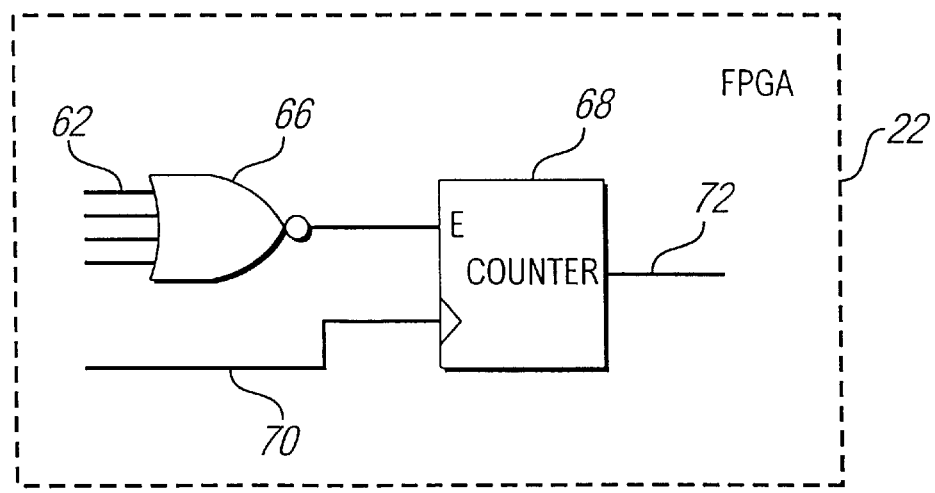
FIG. 8 is a block diagram illustrating the computation of a signal that advances the simulation time.

When none of the BUSY signals 62 are asserted, the current simulation cycle is completed. The circuit that detects such completion and advances the simulation to the next cycle is shown in FIG. 8. It consists of a NOR gate 66 with the number of inputs corresponding to the number of BUSY signals 62 used, and the counter 68. Although four BUSY signals 62 are shown as the inputs to NOR 66, it is understood that any number of BUSY signals 62 can be employed. When none of the BUSY signals is asserted the NOR gate 66 enables the operation of the counter 68. The counter is clocked by a fast periodic clock signal 70 that runs asynchronously and continuously inside the logic verification system. The frequency of this clock should be higher than the frequency of the signal transitions in the system. After counting the number of clock cycles on clock signal 70 necessary to compensate for the longest propagation delay of BUSY signals 62, the counter 68 overflows producing time advance signal 72 that is propagated to all of the simulation modules 14. In one embodiment of the present invention, global-event-communication bus lines 30 are used to propagate the time advance signal among all of the simulation modules 14.

Figure 9:
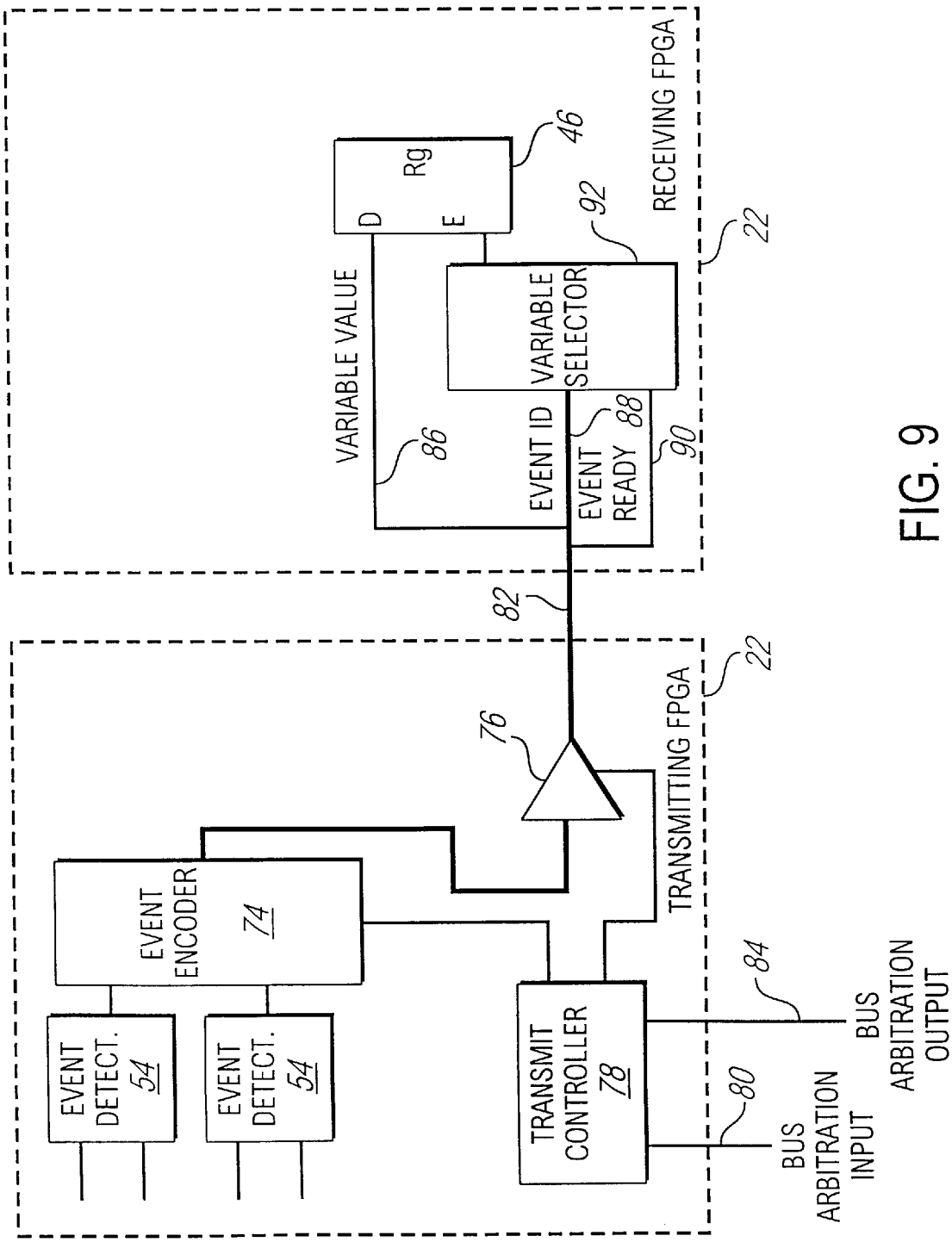
FIG. 9 is a block diagram depicting the transfer of the events from one microprocessor to another over a shared multiplexed bus.

FIG. 9 details the transferring of the events from one FPGA 22 to another over a shared multiplexed bus 82. This method of data transfer is used in one embodiment of the present invention in order to conserve the valuable resources of the programmable interconnect 12.

The transmitting FPGA 22 (shown on the left of FIG. 9) includes a second event encoder 74 similar in its functionality to the event encoder 56. The transmitting FPGA 22 further includes the bus driver 76 (which is similar to the bus driver 58) and the transmit controller 78. When the transmit controller 78 detects the bus arbitration input signal 80, it checks if the event encoder 74 has any active signals at its inputs coming from a plurality of event detectors 54. If such signals exist, it enables the transmission of the first event ID through bus driver 76 and onto the shared multiplexed bus 82. After a number of cycles of the fast periodic clock signal 70 (not shown) necessary to compensate for the longest propagation delay of bus 82, transmit controller 78 signals event encoder 74 to reset the event detector 54 corresponding to the event already transmitted, and to bring up the next event in a predefined order. After transmitting all events, the transmit controller 78 disables the bus driver 76 and asserts the bus arbitration output signal 84, thus relinquishing control over the bus 82. Bus arbitration output signal 84 of one simulation module 14 is connected to bus arbitration input signal 80 of another simulation module 14 to form a daisy chain.

In the receiving FPGA 22 (shown on the right of FIG. 9), the shared multiplexed bus 82 splits into event ID lines 88, variable value line 86, and event ready line 90. On detection of an event ready signal 90, a variable selector 92 recognizes the combination of values on lines 88 as indicative of a particular variable. In response, the variable selector 92 enables the register 46 that captures the new value of the variable from the line 86.

In one embodiment of the present invention, global-event-communication bus lines 30 are used to implement the shared multiplexed bus 82 and sections of the daisy chain 32 are used to implement the bus arbitration signals 80 and 84.

Figure 10:
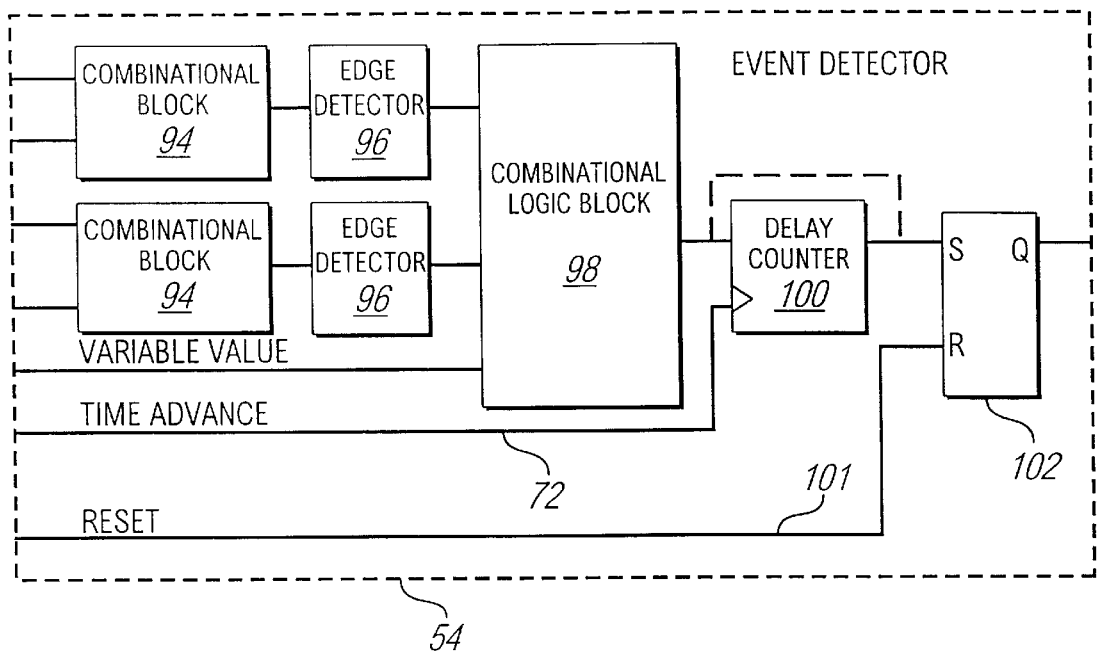
FIG. 10 is a block diagram of an event detector.

FIG. 10 details the preferred embodiment of the event detector 54. It includes a combinational logic block 98 with one or more inputs and one output. One or more of the inputs of the block 98 may be connected directly to the signals that represent the variable values. Other inputs of the block 98 may be connected to the signals that represent the variable values through other combinational blocks 94 and edge detectors 96. The edge detectors 96 detect the positive edge, the negative edge, or any edge of their input signals. The construction of edge detector is not shown but could be readily reproduced by one of skill in the art, and is well known in the art.

As shown in FIG. 10, the output of combinational block 98 is connected to the "Set" input of flip/flop 102 directly or through the delay counter 100. In the latter case, the output signal of the combinational logic block 98 enables the delay counter 100 which is clocked by a time advance signal 72. After counting the predetermined number of time advance signals 72, the counter 100 overflows and produces the signal at the output of event detector 54. After the event output has been transmitted, event detector 54 is reset using the reset line 101 by event encoder 56 as explained previously.

The general structure shown in FIG. 10 can implement an arbitrary level sensitive event control (using only combinational logic block 98), or edge sensitive event control (also using the combinational blocks 94 and edge detectors 96), or delay (also using the delay counter 100), or any combination thereof. Each particular event detector 54 can have all or only a portion of those capabilities, as needed.

Emulation technology in general is not appropriate for verification of the actual timing of the design in the sense of computing the accurate time intervals between various input and output signal events. Correct model timing is important, therefore, only as a method of ensuring the correct evaluation order of different circuit components which have data dependencies on each other. The most important case of this timing correctness problem is the evaluation of chains of flip/flops with possible hold-time violations. There is a specified "setup time" and "hold-time" for any clocked device. Setup time requires that input data must be present at the data input lead of a flip-flop device and in stable form for a predetermined amount of time before the clock transition. Hold-time requires that the data be stable from the time of the clock transition on arrival at the control lead of a flip-flop up to a certain time interval after the arrival of the clock for proper operation. A key process in implementing a logic circuit from a user's netlist is to synchronize the setup and hold-time of data with the arrival of a corresponding clock. Data must be present and stable at the D input of a flip-flop for a specific space of time with respect to the arrival of the corresponding clock at the clock input to ensure the proper operation of the implemented logic circuit. In implementing a circuit from a user's netlist, the proper timing of clock signals may be hindered due to excessive delay in the clock lines by reason of clock skew. This may cause data in a first logic device such as a flip-flop or shift register to shift earlier than data on second register. The hold-time requirement of the second register is violated and data bits may then be lost unless the shift registers are properly synchronized.

Hold-time violations may not occur in the target system or end product because the violation is an artifact of emulation circuits. This is because hold-time violations result from clock skews in the emulation circuit that are frequently different from clock skews in the target system, since limited resources in reprogrammable logic devices are designed to support the generation of clock signals. Since behavioral simulation in the logic verification system requires co-existence of the simulated and the emulated circuit components, it is important that compatible means are used for timing correctness in both technologies.

In simulation technology, model timing is described by the appropriate language constructs such as delays and non-blocking assignment statements. Timing is correct by definition as long as the semantics of such constructs are correctly interpreted by the simulator. This is true even in the case of zero-delay simulation when the actual delay values are presumed unknown. For example, two flip/flops could each be defined by the following behavioral code in Verilog hardware description language which will ensure correct order of evaluation:

```
        always @ (posedge clk)
                q = #0 d;
or
        always @ (posedge clk)
                q < = d;
```

The interpretation of explicit delays, zero delays, and non-blocking assignments is based on assigning the events to different simulation cycles or to different groups in the same cycle. These event assignments enforce the event order implied by language semantics for the behavioral design portion.

In emulation technology, however, the pair of serially connected flip/flops are described as:

```
        always @ (posedge clk1)
                q1 = #t1 d1;
        always @ (posedge clk2)
                q2 = #t2 d2;
                assign #td d2 = q1;
                assign #tc clk2 = clk1;
```

(All emulation circuit delays t1, t2, td, and tc are unknown but have an upper bound T.) In order to ensure correct evaluation order, the emulator artificially increases the value of td by T. The emulator also performs circuit transformations (such as separation of the common part of the clock tree into a special FPGA device and duplication of the clock logic) so that the value of T is as small as possible. This process is explained in U.S. Pat. No. 5,475,830, "Structure and Method for Providing a Reconfigurable Emulation Circuit without Hold Time Violations," issued on Dec. 12, 1995 to Chen et al. (assigned to Quickturn Systems, Inc.).

Each approach to ensuring timing correctness is consistent within its own domain. However, mixing emulation and simulation model timing together may create a problem. Consider for example, the possibility that the second flip/flop in a chain, or any part of its clock logic, is described as zero-delay behavior (i.e., a simulation model) rather than as an emulation model. In this case the upper bound T of the delay values cannot be determined and the method of ensuring timing correctness used by a typical emulator will not work.

One solution to eliminate hold-time violations places an additional flip/flop upstream along the datapath of each emulation flip/flop. An example of this approach is shown in U.S. Pat. No. 5,259,006, "Method for Substantially Eliminating Hold Time Violations in implementing High Speed Logic Circuits or the like," issued on Nov. 2, 1993 to Price et al., (assigned to Quickturn Systems, Inc.). However, this solution is difficult or impossible to apply in a behavioral verification system because it would require each behavioral block to be classified as either flip/flop or a combinational circuit in order to determine if an additional flip/flop needs to be inserted. It would also be necessary to identify each input of such block as a data input or clock input. Such identification is difficult or impossible because of hardware description language constraints. If an additional flip/flop is placed upstream of a combinational logic block it can alter the behavior intended by the designer.

Figure 11:
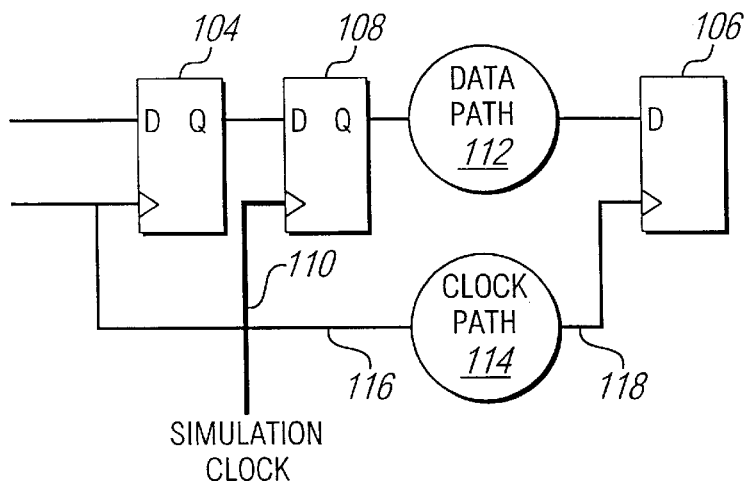
FIG. 11 is a block diagram that illustrates one transformation made to the logic design under verification to prevent hold-time violations during emulation of the design.

One solution offered by the present invention is a different kind of delay-independent hold-time violation elimination. As shown in FIG. 11, for every emulation flip/flop 104 that is a source of a signal that could potentially reach any other circuit component 106 with a hold-time violation, an additional flip/flop 108 is inserted downstream. The simulation clock 110 is asserted at the time all of the BUSY signals 62 are deasserted. As a result, the effective delay in the datapath 112 stemming from the flip/flop 104 is always larger than any delay in a combinational clock path 114 separating clock signal 116 of flip/flop 104 and clock signal 118 of flip/flop 106, no matter if flip/flop 104 is emulated or simulated.

Figure 12:
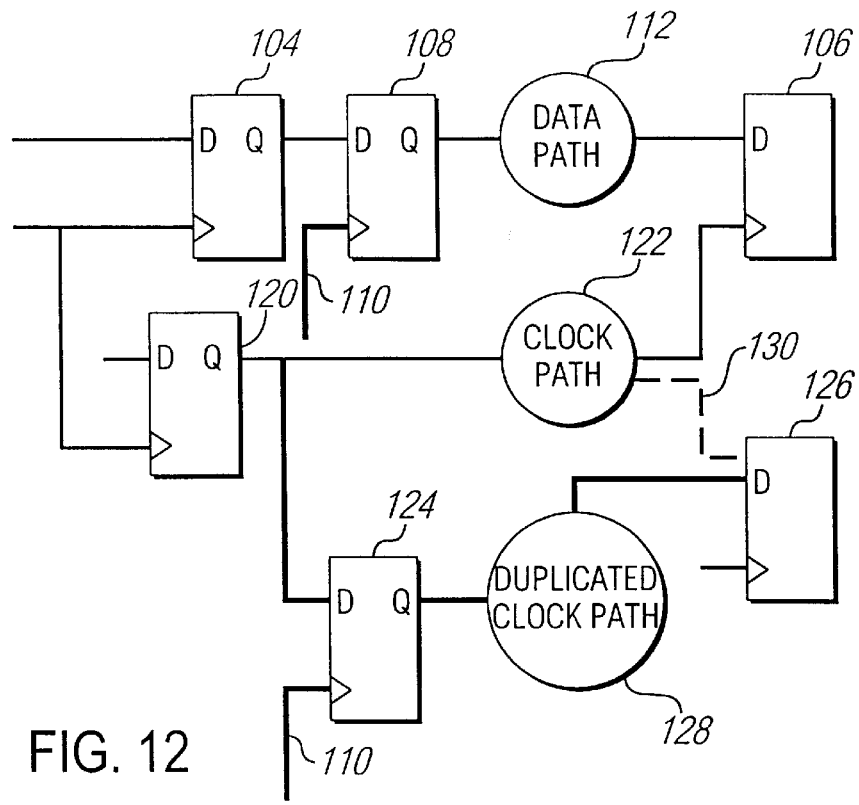
FIG. 12 is a block diagram that illustrates another transformation made to the logic design to prevent hold-time violations during the design emulation.

A more complicated situation is shown in FIG. 12 where an emulated flip/flop 120 exists in a clock circuit 122. Assuming that the design intent was that the delay of circuit 122 is less than the delay of circuit 112, an additional flip/flop should not be inserted in clock circuit 122. If the signal produced by such flip/flop 120 is also used as data source for another flip/flop 126 then the addition of flip/flop 124 and duplication of circuit 122 as circuit 128 is necessary as shown in FIG. 12. Signal 130 previously connecting circuit 122 with flip/flop 126 should be eliminated. For these transformations to be applied correctly, clock circuit analysis needs to be performed that will determine which clock edges could potentially be active on the clock inputs of every storage element (either emulated or simulated). For behavioral blocks, conservative assumptions as to their storage capability may be applied because, even if an extra flip/flop is erroneously identified as posing the danger of hold-time violation, the transformation will not alter the function performed by the circuit under verification. In the worst case every flip/flop in the emulated portion of the circuit will have to be duplicated with a flip/flop synchronized by the simulation clock signal 110.

Figure 13:
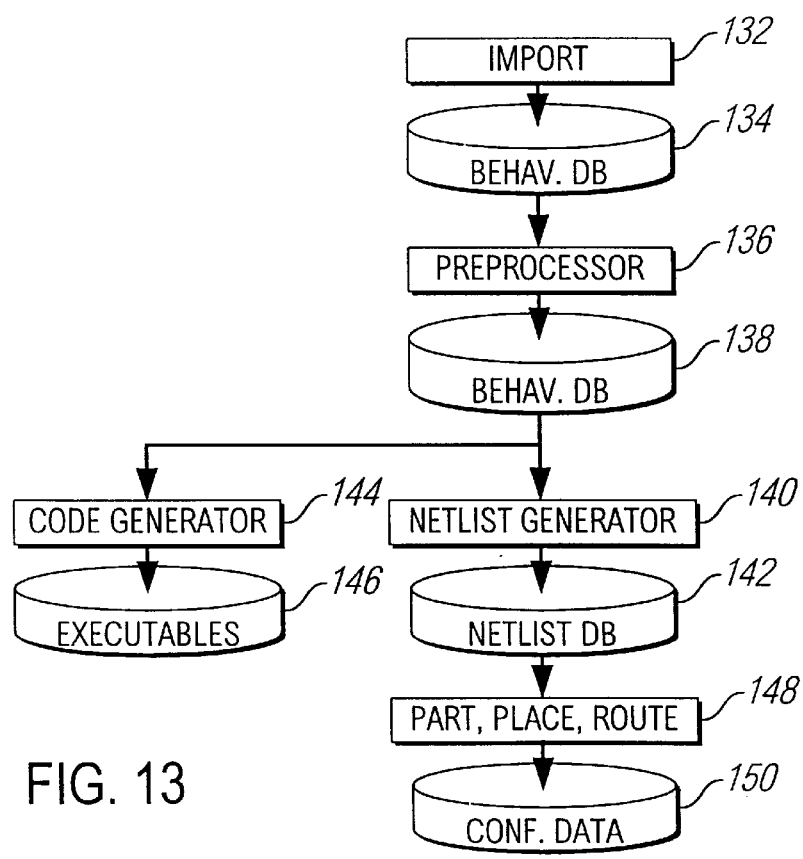
FIG. 13 is a block diagram showing the programming of the logic verification system.

FIG. 13 shows a flow diagram for preparing configuration data to be used by the logic verification system. In general, the compilation starts from the user's design description file in, for example, Verilog hardware description language ("Verilog HDL"). However, the compilation could start with a variety of other languages. As a result of an import step 132, the behavioral database representation 134 is created. This representation is augmented by preprocessing step 136 resulting in another behavioral representation 138. Netlist generation step 140 and code generation step 144 result in a netlist representation of an emulation model 142 and a set of executables 146 downloadable into logic module processor memories 20. The netlist representation 142 is subjected to partitioning, placement, and routing step 148 which produces the configuration data 150 for FPGAs 10, 22 and programmable interconnect 12. The partition, placement and routing step is described in U.S. Pat. No. 5,329,470 to Sample et al. and U.S. Pat. No. 5,036,473 to Butts et al. and is well known to one skilled in the art.

More specifically, the importer 132 processes the user's Verilog source files and produces a behavioral database library. It accepts a list of source file names, "include" paths, and a list of search libraries where the otherwise undefined module references are resolved. The importer divides the behavioral description into a set of concurrently executable code fragments.

The preprocessor 136 transforms the behavioral database library created by import step 132. It partitions the behavioral code into clusters directed for an execution on each of the available simulation modules 14, determines the execution order of the behavioral code fragments, and the locality of variables in the partitions. Also, the preprocessor 136 performs transformations necessary for the creation of a hold-time-violation-free model as described above.

The code generator 144 reads the behavioral database library as transformed by the preprocessor 136 and produces downloadable executables 146 for each of the simulation modules 14 as identified by the preprocessor 136.

The netlist generator 140 reads the behavioral database library as transformed by the preprocessor 136 and produces a netlist database library for further processing by the partitioning, placement, and routing step 148.

The operation of the logic verification system is based on the principles of event-driven simulation which are well known to one skilled in the art. The basic assumptions are as follows: (1) Any given behavioral model can be divided into a set of evaluation procedures, which are complied based on behavioral descriptions; (2) the process of simulation consists of a series of executions of these procedures in which they read the logic values of some variables (inputs) and compute the new values of some other variables (outputs); and (3) the procedures are assigned triggering conditions which define whether or not to execute each procedure depending on the current state of the simulation model.

Figure 15:
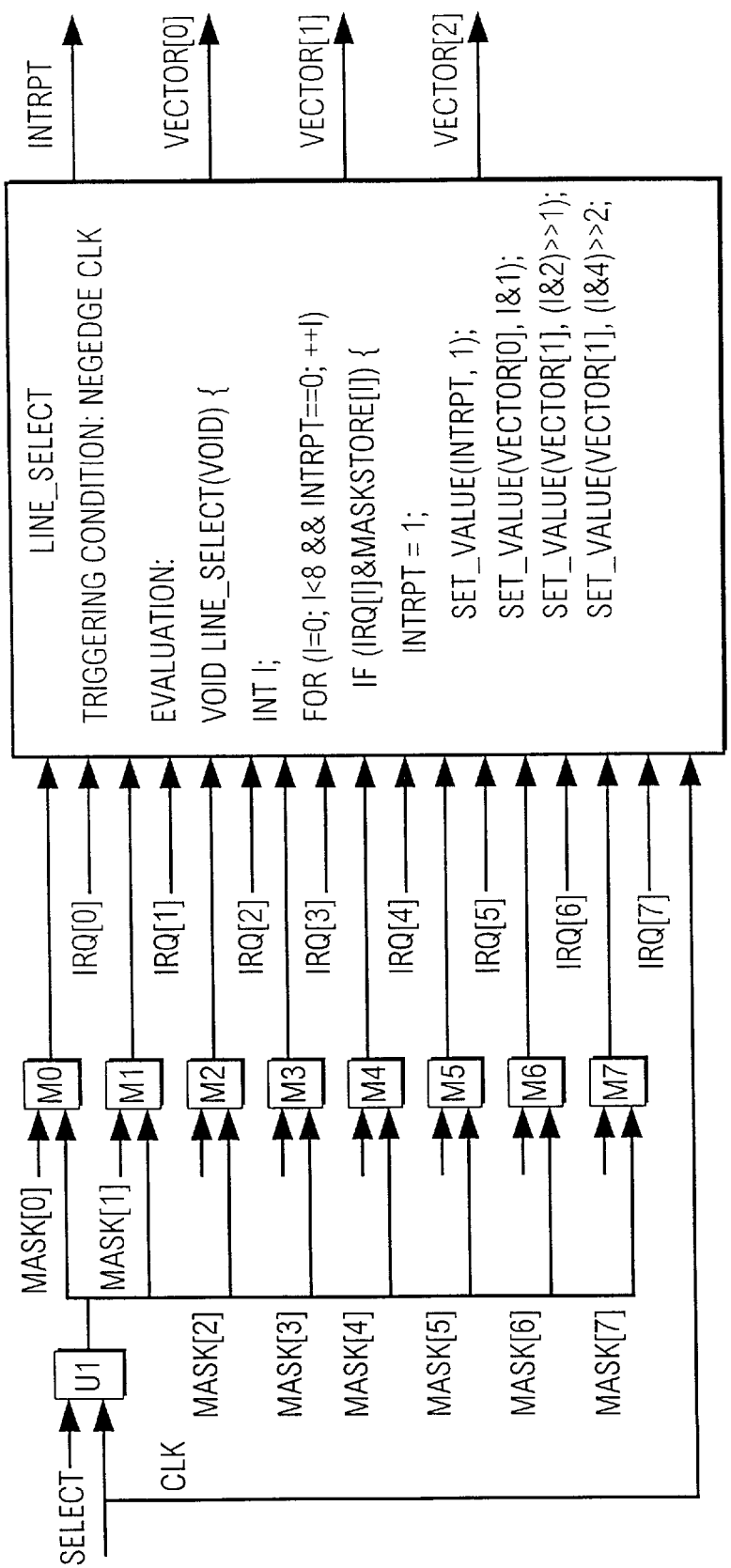
FIG. 15 illustrates an example of an intermediate representation of the logic design in the behavioral database (after the completion of the import step 132 shown in FIG. 13).

For example, consider the Verilog HDL model shown in FIG. 14. This model consists of 10 evaluation procedures, starting with Q_ANO2. Nine of these procedures are predefined by reference to the library primitives Q_ANO2 and Q_FDPO and one is represented with a behavioral description. The relationship between evaluation procedures can be described by a graph as shown in FIG. 15.

Figure 16:
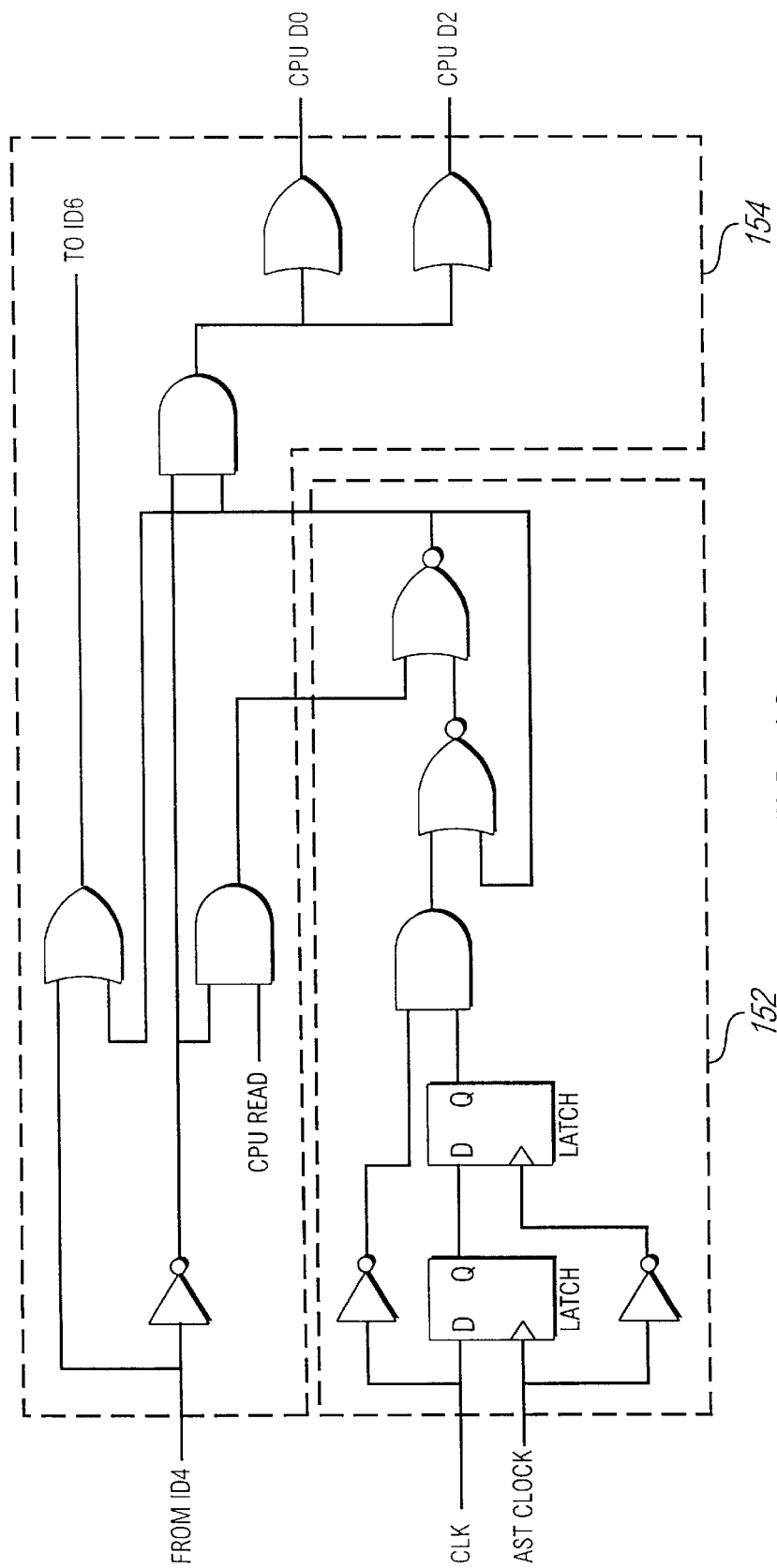
FIG. 16 illustrates an example of a circuit fragment created by the netlist generation step 140 (step shown in FIG. 13).

For purposes of emulation, instances U1 and m0–m7 can be directly implemented in a FPGA. Behavioral code that evaluates the outputs of instance line_select can be compiled as a sequence of instructions for an embedded microprocessor. In order for this sequence to be invoked at the appropriate time, an unique ID has to be assigned to each such sequence loaded into one microprocessor. The ID can be generated in an FPGA when the corresponding triggering condition becomes true. (The circuitry for generating IDs was previously described in FIG. 5.) If several triggering conditions become true at the same time, the smallest of their IDs is generated. The microprocessor 16 continuously monitors the IDs and each time a new ID is generated, the corresponding instruction sequence is executed. Assuming that the ID of line_select function is 5, the event-generating logic could be implemented as shown in FIG. 16. When the negative edge of CLK is detected (synchronized by a fast periodic signal) it sets an RS-trigger in an event detector 152. If there are no events with IDs less than 5, then the event encoder 154 generates the number 5 and the microprocessor 16 detects the number 5 when a read instruction is executed from one of the addresses that belong to FPGA address space. At this time RS-trigger is reset. (The operation decoder, bus drivers and data register are not shown.)

The operation method can be summarized as follows. At model compile time the cells represented with behavioral code (e.g., line_select cell in FIG. 15) are replaced with their corresponding event generation logic blocks (similar to the one shown in FIG. 16.) At execution time, the microprocessor 16 is continuously running in a loop that consists of reading the ID of the next event from the FPGA, and executing a function corresponding to this event. An example of a program that could be used by microprocessor 16 to perform this operation is shown in FIG. 17.

This software-hardware implementation of a simulation algorithm combines the best features of levelized and event-driven simulation. As in event-driven simulation, only those primitives are evaluated at each cycle for which the activation conditions are satisfied. As in levelized compiled simulation, the overhead of event queue manipulation is removed from the model execution phase. All necessary event detection and manipulation is done in reconfigurable hardware (FPGAs). The event-detection hardware netlist is generated at compile time based on the triggering conditions for each evaluated routine, as well as the results of model partitioning and sorting.

While a presently-preferred embodiment of the invention has been disclosed, it will be obvious to those skilled in the art that numerous changes may be made without departing from the spirit or scope of the invention. It is intended that all matter contained in the above description and shown in the accompanying drawings shall be interpreted as being illustrative and not limiting. The invention, therefore, is not to be limited except in accordance with the below claims.

We claim:

1. An apparatus for verification of a user's logic design comprising:

a plurality of first reconfigurable logic devices interconnected by a programmable interconnect, said plurality of reconfigurable logic devices and said programmable interconnect used for emulation of at least a portion of said user's logic design;

at least one simulation module, said at least one simulation module comprising a microprocessor, a memory device, and a second reconfigurable logic device, said microprocessor, said memory device and said second reconfigurable logic device in communication with each other through a data bus, said at least one simulation module used for simulation of at least a portion of said user's logic design; and an event detector in electrical communication with said at least one simulation module for detecting events taking place during verification.

2. The apparatus of claim 1 further comprising a scheduler for scheduling operations that said microprocessor would ordinarily schedule.

3. The apparatus of claim 1 wherein said at least one simulation module further comprises a second microprocessor.

4. The apparatus of claim 1 further comprising a bus controller in electrical communication with said microprocessor.

5. The apparatus of claim 1 wherein each of said plurality of first reconfigurable logic devices comprise a field programmable gate array.

6. The apparatus of claim 5 wherein said second reconfigurable logic device comprises a field programmable gate array.

7. The apparatus of claim 6 wherein each of said plurality of first reconfigurable logic devices and said second reconfigurable logic device comprise identical field programmable gate arrays.

* * * * *